(12) United States Patent
Oku et al.

(10) Patent No.: US 6,357,106 B1
(45) Date of Patent: Mar. 19, 2002

(54) METHOD FOR MOUNTING PARTS AND MAKING AN IC CARD

(75) Inventors: Mitsumasa Oku, Osaka-fu; Takashi Akiguchi, Osaka; Shinji Murakami, Yahata; Yutaka Harada, Kyoto; Norihito Tsukahara, Kyoto-fu; Mitsunori Yokomakura, Takatsuki; Kenichi Sato, Ikoma, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/257,268

(22) Filed: Feb. 25, 1999

(30) Foreign Application Priority Data

Mar. 3, 1998 (JP) ............................. 10-049910

(51) Int. Cl.[7] ............................. H01F 41/10
(52) U.S. Cl. ........................ 29/602.1; 29/840
(58) Field of Search ................. 29/602.1, 601, 29/600, 840

(56) References Cited

U.S. PATENT DOCUMENTS 4,547,961 A * 10/1985 Bokil et al. ................. 29/602.1
4,626,816 A * 12/1986 Blumkin et al. ......... 29/602.1 X
5,307,045 A * 4/1994 Senda et al. ............ 29/602.1 X

FOREIGN PATENT DOCUMENTS

| JP | 63-25096 | | 2/1988 |
|---|---|---|---|
| JP | 2143591 | * | 6/1990 |
| JP | 2158191 | * | 6/1990 |
| JP | 5304189 | * | 11/1993 |
| JP | 9-1970 | | 1/1997 |
| JP | 9-300868 | | 11/1997 |

* cited by examiner

*Primary Examiner*—Carl E. Hall
(74) *Attorney, Agent, or Firm*—Parkhurst & Wendel, L.L.P

(57) ABSTRACT

A method for mounting parts, and an IC card and its manufacturing method. The method reduces the number of steps, increases productivity, lowers costs, and miniaturizes the chip. A first electrode of the IC chip for processing signals received from a coil is connected to an internal end of a coil pattern formed on a first substrate, and an external end of the coil pattern and a second electrode of the IC chip are connected via a jumper wire.

4 Claims, 13 Drawing Sheets

(a)

(b)

(a)

(b)

(c)

(d)

METHOD FOR MOUNTING PARTS AND MAKING AN IC CARD

FIELD OF THE INVENTION

The present invention relates to a method for mounting parts by means of conductive paste, and an IC card and its manufacturing method.

BACKGROUND OF THE INVENTION

In manufacturing a non-contact IC card comprising a coil and an IC chip, and transferring data with external via the coil, coils such as a copper wire-wound coil, coils of printed conductive pastes, e.g. silver paste, and coils of etched metal foils, e.g. copper foil, are used as a coil, and in particular, a method for forming a circuit pattern by printing conductive pastes has become popular.

FIGS. 10 to 13 show a conventional IC card and its manufacturing method.

As shown in FIG. 10, the conventional IC card is constructed such that a coil pattern 2 is formed on the first substrate 1a by means of a conductive paste, and a connecting pad 6 provided at the external end 3a of this coil pattern 2 and a connecting pad 6 provided at the internal end 3b are electrically connected with electrodes of an IC chip 4.

The manufacturing process is shown in FIG. 11.

Firstly, in step 1, a circuit pattern including the coil pattern 2 is printed on the surface of the first substrate 1a by means of the conductive paste.

In step 2, the printed circuit pattern is heated for 10 minutes at the temperature of 120° C. to cure the conductive paste.

In step 3, as shown in FIG. 12(a), an anisotropic conductive sheet 9 is stuck on the connecting pad 6 of the circuit pattern.

In step 4, the anisotropic conductive sheet 9 is heated for 5 seconds at the temperature of 100° C. and temporally pressed.

In step 5, parts such as the IC chip 4 and capacitors are mounted on the temporally pressed anisotropic conductive sheet 9.

A bump 10 is formed on an mounting surface of the parts 16 via an electrode pad 7, as shown in FIG. 12(b), and the bump 10 is electrically connected with the connecting pad 6 via the anisotropic conductive sheet 9, as shown in FIG. 12(c).

Particularly, the IC chip 4 is placed such that, as described above, the connecting pads 6 provided at the external end 3a and the internal end 3b of the coil pattern 2 are electrically connected with the electrode pad 7 of the IC chip 4.

And, the bump 10, formed by using wire bonding and plating, in particular, plating using solder, gold, silver, and copper is used.

In step 6, the anisotropic conductive sheet 9 is heated for 30 seconds at the temperature of 200° C. to be cured for pressing the parts 16 as shown in FIG. 12(d).

Then in step 7, by applying a second substrate to the first substrate 1a for laminating processing, as shown in FIG. 13, the IC card can be obtained in which the connecting pads 6 and the bump 10 provided on the parts 16 are electrically connected via the anisotropic conductive sheet 9. 5 denotes a capacitor connected in parallel to the coil pattern 2, and 1b denotes the second substrate.

However, since it is typical to use inexpensive thermoplastic resin such as polyethylene terephthalate and vinyl chloride for the first substrate 1a and the second substrate 1b, there is a problem that, in the conventional manufacturing process described above, these substrates having less heat resistance are susceptible to degradation due to the high temperature of 200° C. or more when pressing the anisotropic conductive sheet 9 in step 7.

Also, there is a problem that using a substrate having superior heat resistance instead of the thermoplastic resin increases the costs.

And there is a further problem that the connecting resistance and the number of steps are increased, and the productivity is lowered, and costs are increased because the anisotropic conductive sheet is used for securing the parts. And it is the same with the case of using an anisotropic conductive particle instead of the anisotropic conductive sheet.

And, when the parts 16 are mounted in step 5, there is a problem that it is needed to draw a plurality of coil patterns 2 between the terminals of the IC chip 4, as shown in FIG. 10, since the external end 3a and internal end 3b of the coil pattern 2 are constructed not so as to be linked to each other in a single brush stroke.

DISCLOSURE OF THE INVENTION

The present invention provides a method for mounting parts, and an IC card and its manufacturing method, that is capable of solving the problems, reducing the number of steps, increasing the productivity to lower costs, and miniaturizing the chip.

To solve the problems, the method for mounting parts according to the invention is characterized in that parts to be mounted are placed on the circuit pattern before the conductive paste is cured, and then mounted by curing the conductive paste.

According to the invention, it is possible to lower costs due to the reduction of steps, the good productivity, and the possibility of the low temperature mounting of the parts, and further to contribute to the miniaturization of the IC chip.

The method for mounting parts according to a first embodiment of the invention is characterized in that a circuit is formed by printing a circuit pattern on a substrate by means of a conductive paste, placing parts on the circuit pattern such that its electrode is connected to the circuit pattern, and curing the conductive paste to electrically connect the electrode with the circuit pattern.

According to this configuration, it is possible to mount parts at low temperatures and reduce steps to lower costs.

The method for mounting parts according to a second embodiment of the invention is characterized in that a circuit is formed by printing a circuit pattern on a substrate by means of a conductive paste, placing parts having a pump formed on its electrode pad on the circuit pattern such that its electrode is connected to the circuit pattern, and curing the conductive paste to electrically connect the electrode to the circuit pattern.

The method for mounting parts according to a third embodiment of the invention is characterized in that the bump is formed of metals or plating.

The IC card according to a fourth embodiment of the invention is a non-contact IC card comprising a coil and an IC chip, and transferring data with external via the coil, and is characterized in that a first electrode of the IC chip for processing signals received from the coil is connected to an internal end of a coil pattern formed on the substrate, and an external end of the coil pattern and a second electrode of the IC chip are connected via a jumper wiring means.

According to this configuration, it is possible to reduce manufacturing steps and lower costs, by directly mounting parts on the conductive paste before it is cured, and then by curing the conductive paste, and it is possible to stabilize the circuit pattern, as well as ensure an electrical connection between the circuit pattern and the parts.

And, an anisotropic conductive sheet is not required to provide, and it becomes possible to various parts at low temperature, and also lower resistance can be realized.

And further, it is not required to draw a plurality of coil patterns between the terminals of the IC chip, so that it is possible to use an IC chip having narrow space between the terminals to miniaturize the IC card.

The IC card according to a fifth embodiment of the invention is characterized in that the jumper wiring means is a wire having an insulatingly covered middle portion and ends with exposed conductive portions, or a foil constituted of an insulating sheet with a metal film.

The method for manufacturing the IC card according to a sixth embodiment of the invention is characterized in that, in manufacturing a non-contact IC card comprising a coil and an IC chip, and transferring data with external via the coil, it comprises the steps of printing the circuit pattern including the coil pattern on the substrate by means of the conductive paste, placing the IC chip on the circuit pattern such that its electrode is connected to the circuit pattern, placing the jumper wiring means for connecting over the coil the electrode pad at the external end of the coil to the electrode pad drawn out of the IC chip or a signal line to the IC chip before the conductive paste is cured, and curing the conductive paste.

According to this configuration, it becomes possible to miniaturize the IC card.

The method for manufacturing the IC card according to a seventh embodiment of the invention is characterized in that, in manufacturing a non-contact IC card comprising a coil and an IC chip, and transferring data with external via the coil, it comprises the steps of printing the circuit pattern including the coil pattern on the substrate by means of the conductive paste, placing the IC chip on the circuit pattern such that its electrode is connected to the circuit pattern, and after the conductive paste is cured, placing the jumper wiring means for connecting over the coil the electrode pad at the external end of the coil to the electrode pad drawn out of the IC chip.

The method for manufacturing the IC card according to an eighth embodiment of the invention is characterized in that the jumper wiring means is configured by printing a pattern, which links the electrode pad at the external end of the coil and the electrode pad drawn out of the IC chip, by means of insulating ink at the portion of the coil across the jumper wiring means, and printing conductive ink over the pattern.

According to this configuration, it is possible to make the IC card thinner, and improve the productivity due to its short drying time.

The method for manufacturing the IC card according to a ninth embodiment of the invention is characterized in that, in manufacturing a non-contact IC card comprising a coil and an IC chip, and transferring data with external via the coil, it comprises the steps of printing the circuit pattern including the coil pattern on the first substrate by means of the conductive paste, placing the IC chip on the circuit pattern such that its electrode is connected to the circuit pattern and curing the conductive paste, printing the conductive paste at the position corresponding to the portion in the second substrate laminated on the first substrate which connects the electrode pad at the external end of the coil and the electrode pad drawn out of the IC chip over the coil formed on the first substrate to form the jumper wiring means, applying this second substrate to the first substrate, with an insulating film which has communicating openings formed at the positions corresponding to the electrode pad at the external end of the coil and the electrode pad drawn out of the IC chip being interposed, curing the conductive paste, and connecting the electrode of the first substrate and the conductive paste of the second substrate.

The method for manufacturing the IC card according to a tenth embodiment of the invention is characterized in that, in manufacturing a non-contact IC card comprising a coil and an IC chip, and transferring data with external via the coil, it comprises the steps of printing the circuit pattern on the substrate by means of the conductive paste, placing the IC chip on the circuit pattern before the conductive paste is cured such that its electrode is connected to the circuit pattern, curing the conductive paste, and electrically connecting each end of the coil constituted of a wound line to the circuit pattern.

The method for manufacturing the IC card according to an eleventh embodiment of the invention is characterized in that, in manufacturing a non-contact IC card comprising a coil and an IC chip, and transferring data with external via the coil, it comprises the steps of printing the circuit pattern on the substrate by means of the conductive paste, placing the IC chip on the circuit pattern before the conductive paste is cured such that its electrode is connected to the circuit pattern, placing each end of the coil constituted of a wound line on the circuit pattern before the conductive paste is cured, and curing the conductive paste.

DESCRIPTION OF THE EMBODIMENTS

The embodiments of the present invention will be explained below by means of FIGS. 1 to 8.

Here, the elements, which are similar to those in the above conventional example, is are denoted by the same reference.

FIGS. 1 to 8 show the embodiments of the present invention.

Figure 1:
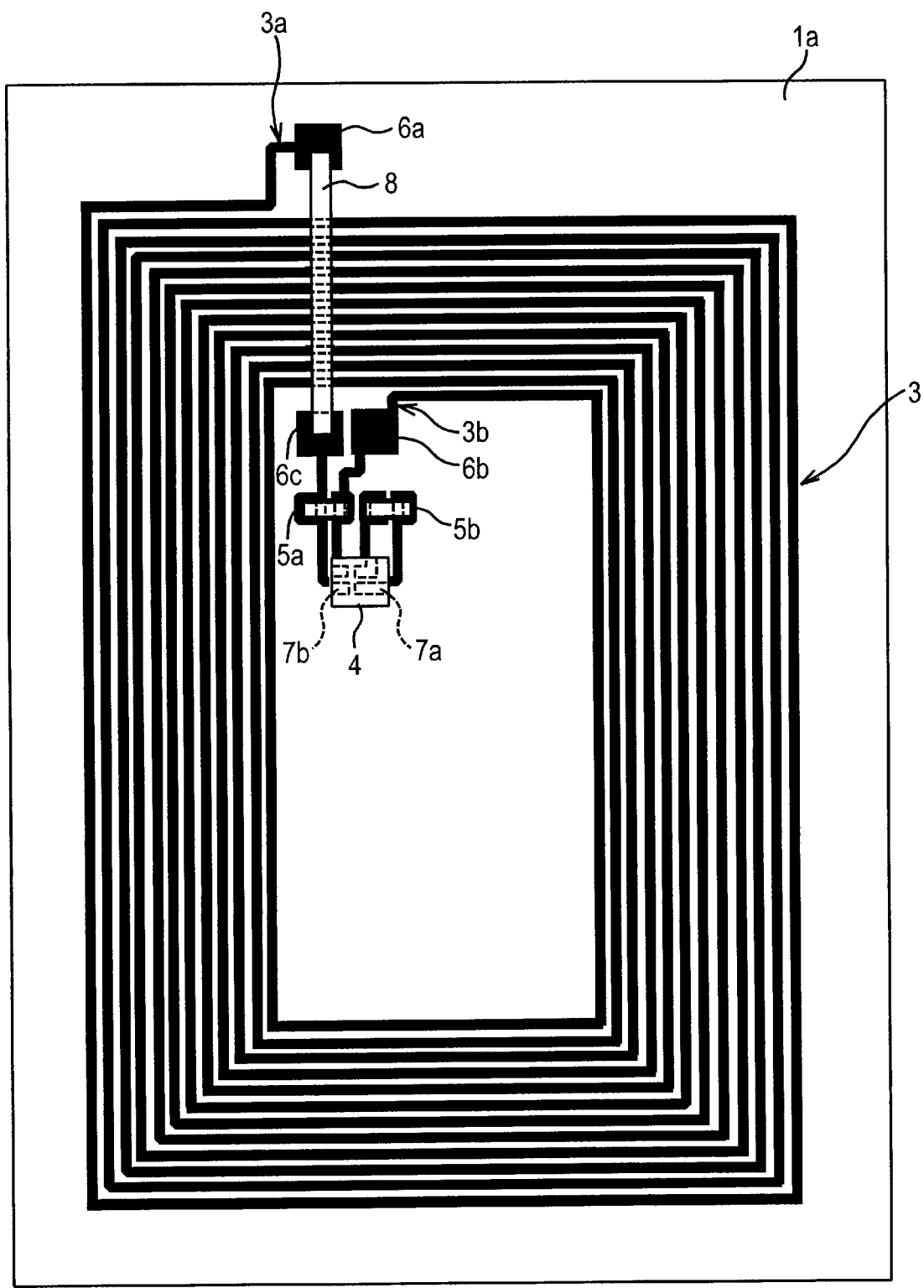
FIG. 1 is a plan view showing an IC card according to an embodiment of the invention.
Figure 10:
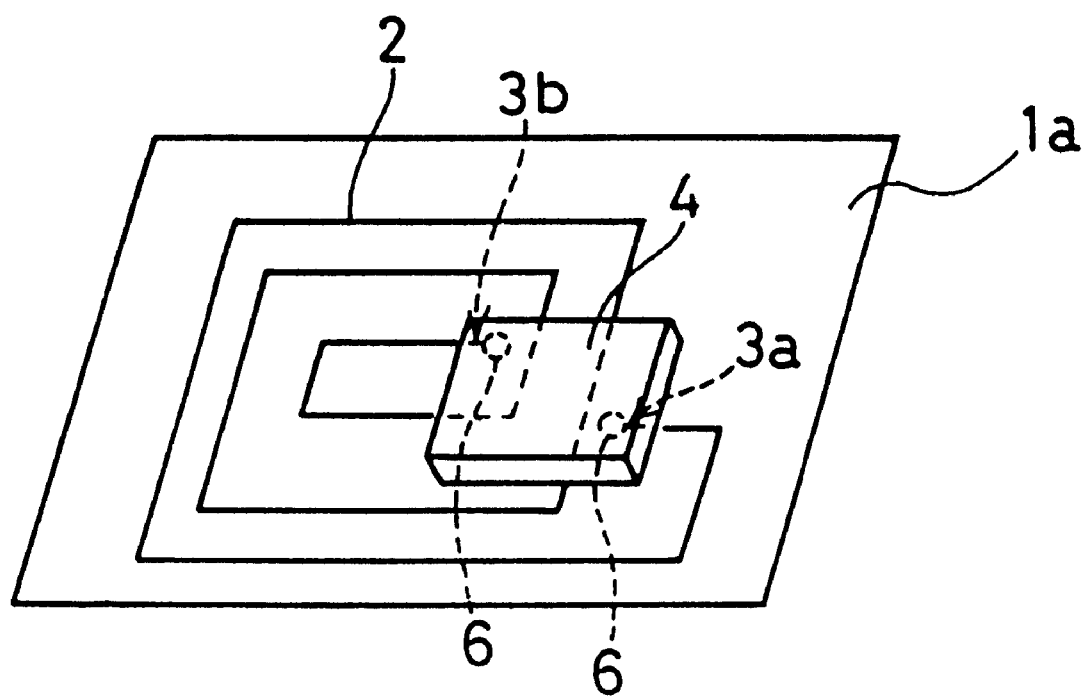
FIG. 10 is a schematic view showing the finished configuration of a conventional IC card.
Figure 11:
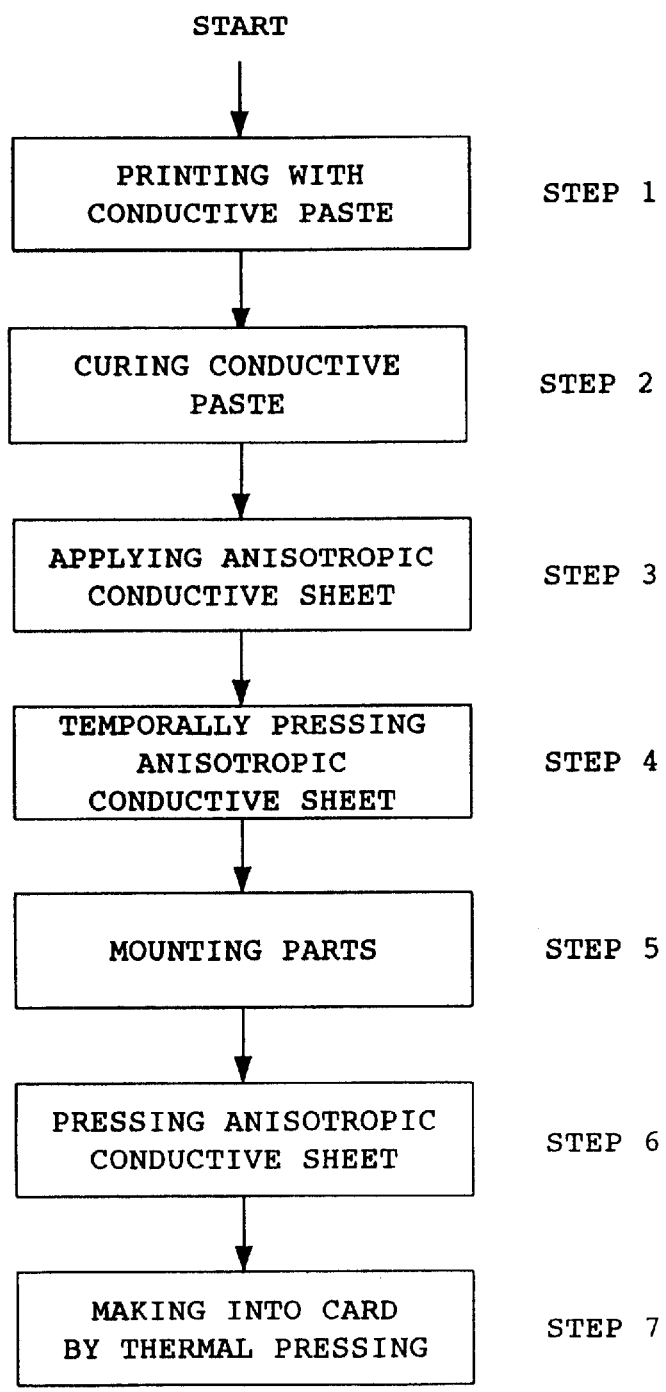
FIG. 11 is a diagram showing a conventional process for mounting a part.
Figure 12:
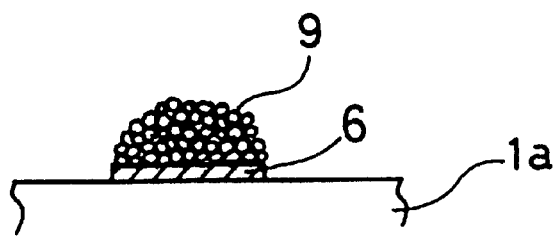
FIGS. 12(a)–(d) are a schematic view showing the process for mounting the conventional IC chip.
Figure 12:
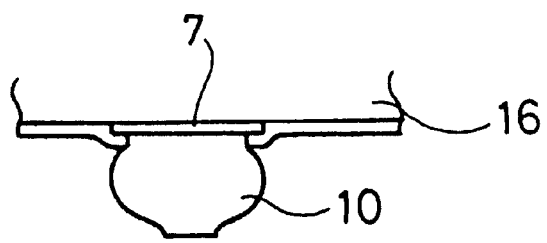
Figure 12:
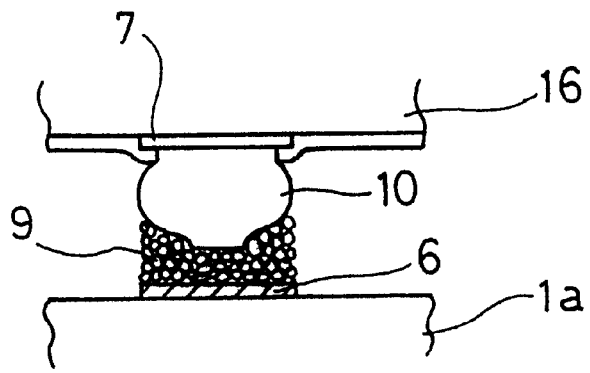
Figure 12:
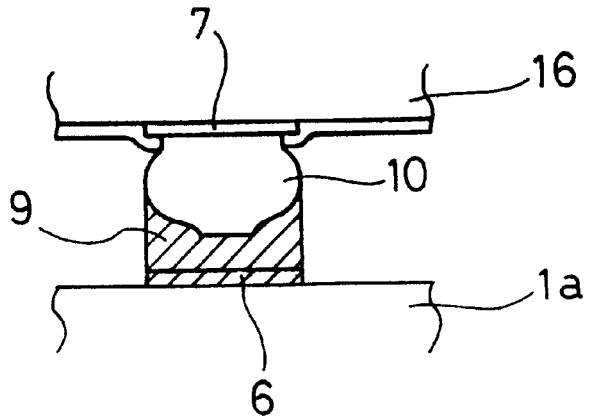

As shown in FIG. 1, an IC card of this embodiment is composed of a coil and an IC chip 4 for performing a process required to transfer signals via this coil, etc., and is different from that in FIG. 10 showing a conventional example in the point that it is configured such that a first electrode pad 7a of the IC chip 4 is set for a connecting pad 6b at an internal end 3b of a coil pattern 3 formed on a first substrate 1a, and an electrode pad 6a at an external end 3a of the coil pattern 3 and a second electrode pad 7b of the IC chip 4 are connected via a jumper wiring means 8.

Here, the coil pattern 3 is cured in the following procedure so as to act as a coil for antenna. 5a denotes a resonant capacitor connected parallel to the coil 3, 5b denotes a capacitor for power supply for charging power received via the coil 3, and this IC card is operated by the power of the capacitor for power supply 5b.

Figure 2:
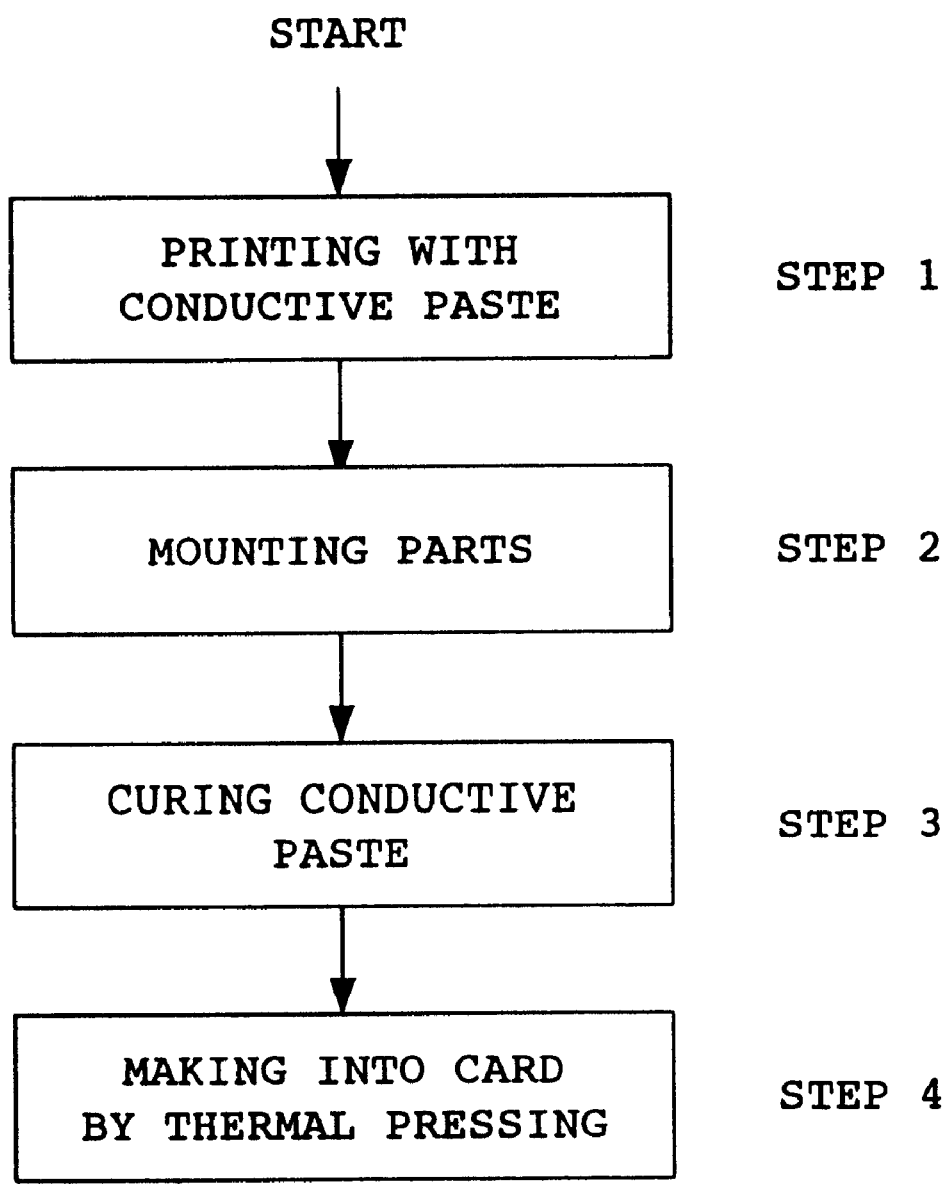
FIG. 2 is a diagram showing a process for manufacturing the IC card according to the embodiment of the invention.

The process for manufacturing this IC card is shown in FIG. 2.

In step 1, a circuit pattern including the coil pattern 3 is printed on the surface of the first substrate 1a by means of a conductive paste.

Figure 3:
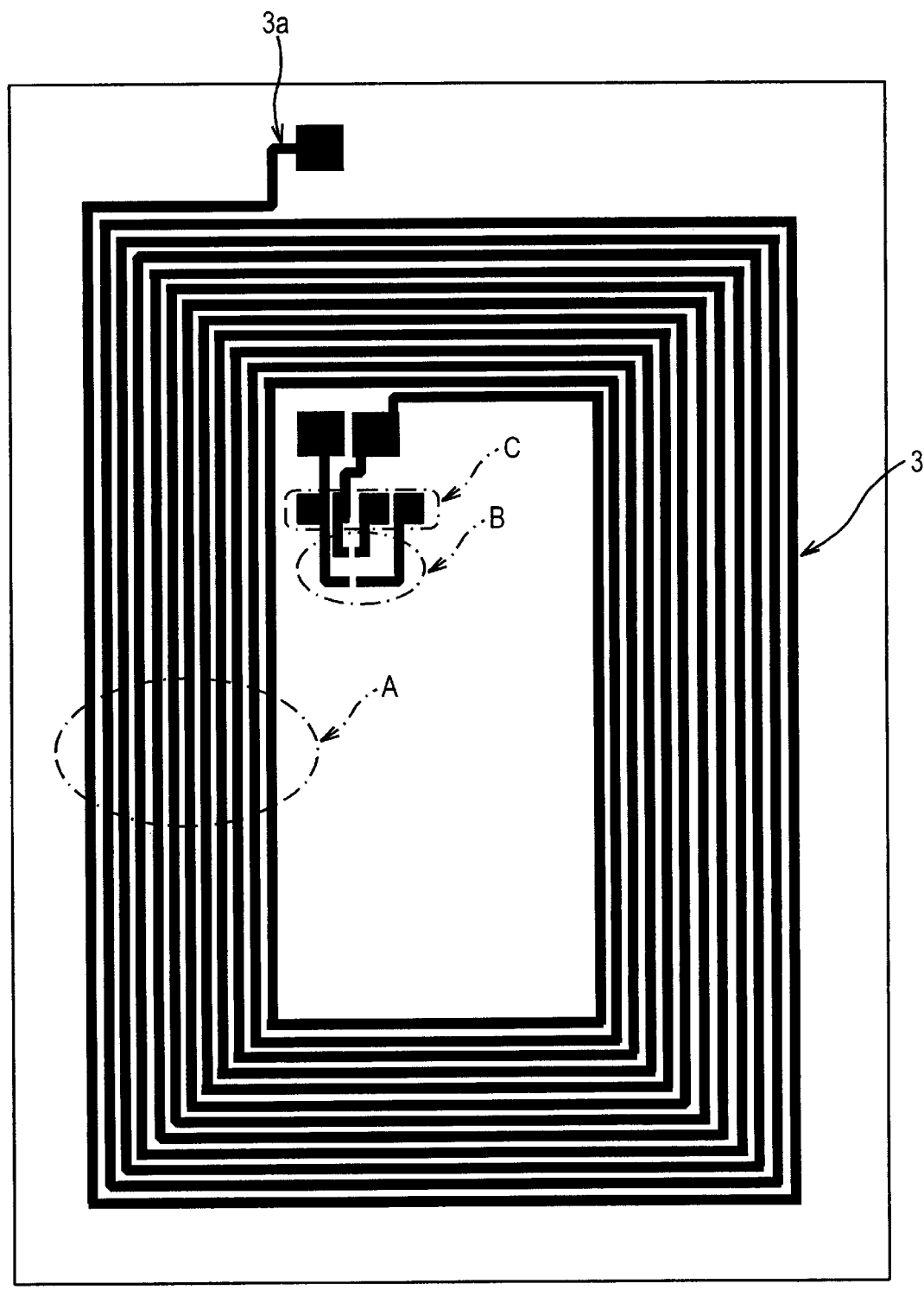
FIG. 3 is a plan view showing a coil pattern according to the embodiment of the invention.

FIG. 3 shows the printed circuit pattern, and a coil is formed in the coil pattern 3 as denoted by an arrow A. An IC mounting portion denoted by an arrow B is formed inside the coil pattern 3, and a capacitor mounting portion denoted by an arrow C is formed at the portion leading to the external end 3a of the coil pattern 3 and the IC mounting portion.

Substrates having a thickness on the order of 0.1 to 0.5 mm made of polyethylene terephthalate, vinyl chloride, acrylonitrile butadiene styrene, and polycarbonate, etc. are used for the first substrate 1a and a second substrate 1b described later.

It is preferable to use a silver paste as the conductive paste.

The conductive paste is printed using screen printing, offset printing, and gravure printing, etc., and for example, is formed in a way that a mask having 165 meshes per inch is used to obtain an emulsion having a thickness of 10 $\mu$m.

In step 2, parts 16 such as the IC chip 4, the capacitors to be mounted on the surface 5a, 5b, and the jumper wiring means 8 are mounted.

Concretely, the IC chip 4 is mounted on the IC mounting portion denoted by an arrow B, and the capacitor for power supply 5a and the resonant capacitor 5b are mounted on the capacitor mounting portion denoted by an arrow C. And the jumper wiring means 8 is provided to link the connecting pad 6a at the external end 3a of the coil pattern 3 and the second electrode pad 7b of the IC chip 4.

In mounting these parts at the predetermined position, in this embodiment, the parts 16 are mounted on the connecting pad 6 before it is cured, while in the above conventional example, the parts 16 are mounted on the connecting pad 6 after it is cured via the anisotropic conductive sheet 9.

Figure 4:
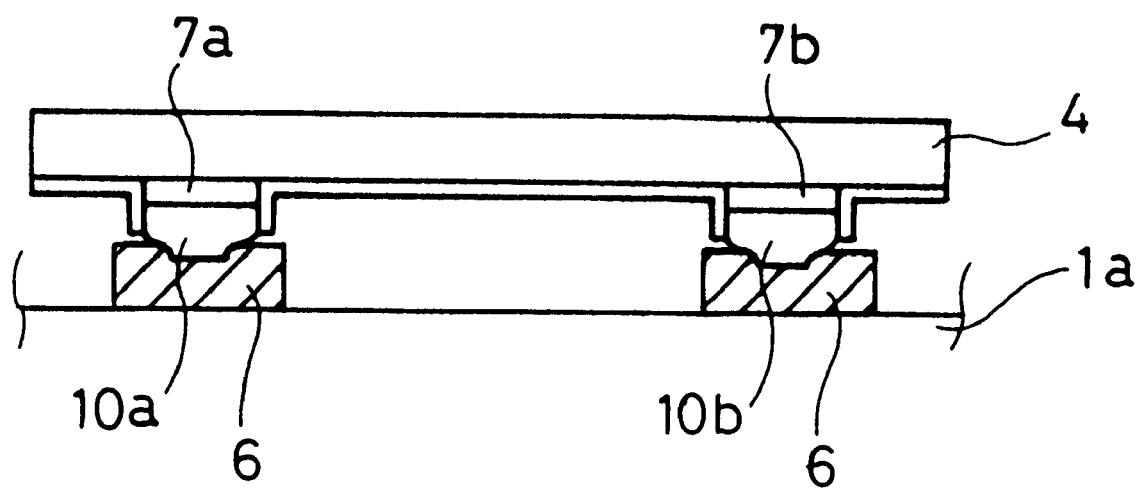
FIG. 4 is a schematic view showing the mounting of the IC chip according to the embodiment of the invention.

Here, the first electrode pad 7a and the second electrode pad 7b are formed on the IC chip 4 in the same way as the above conventional example, and bumps 10 are formed on the first electrode pad 7a and the second electrode pad 7b, and as shown in FIG. 4, the first electrode pad 7a and the second electrode pad 7b are mounted on the connecting pads 6 via bumps 10a and 10b respectively.

Figure 5:
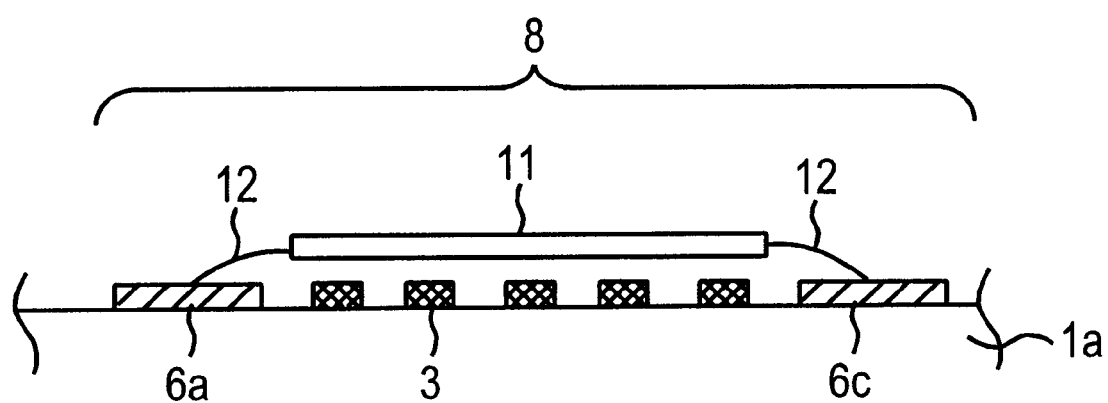
FIG. 5 is a schematic view showing the mounting of a jumper wire according to the embodiment of the invention.

And as shown in FIG. 5, the jumper wiring means 8 is configured to have a covered portion 11, which is an insulator covering the middle portion of a conductive portion made of a conductor, and exposed conductive portions 12 at the opposite ends, and a thin type having a thickness about 0.1 mm is used. The conductive portions 12 on the opposite ends of this jumper wiring means 8 are mounted on the connecting pads 6a, 6c.

In step 3, the conductive paste is cured to secure the parts 16 mounted in step 2.

In this way, only curing the conductive paste makes it possible to stabilize the circuit pattern, as well as to ensure an electrical connection to the parts.

In step 4, the second substrate 1b is opposed to the first substrate 1a configured as described above, laminated with a film, and made into a card by thermal pressing.

Polyethylene terephthalate, vinyl chloride, ABS, and polycarbonate, etc. are used for the laminate.

Figure 6:
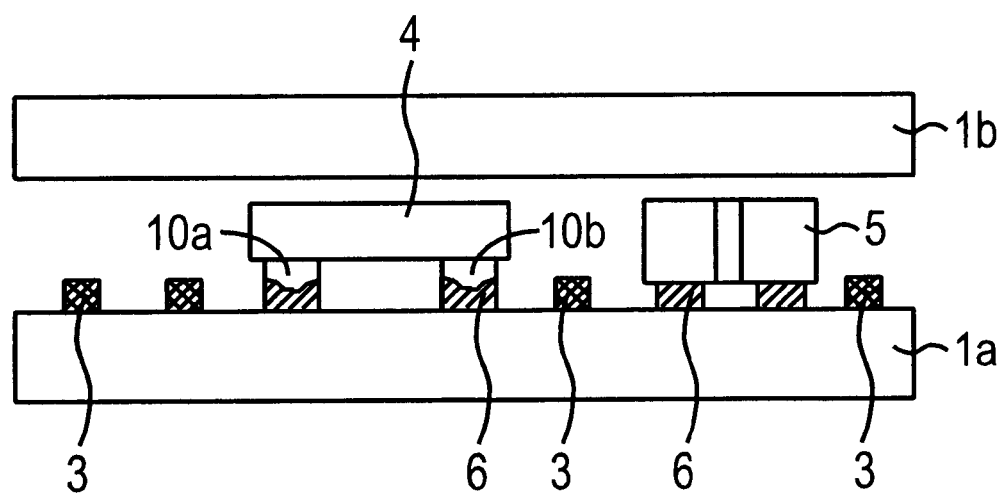
FIG. 6 is a schematic view showing the finished configuration of the IC card according to the embodiment of the invention.

A finished configuration of the obtained IC card is shown in the schematic view of FIG. 6.

Figure 13:
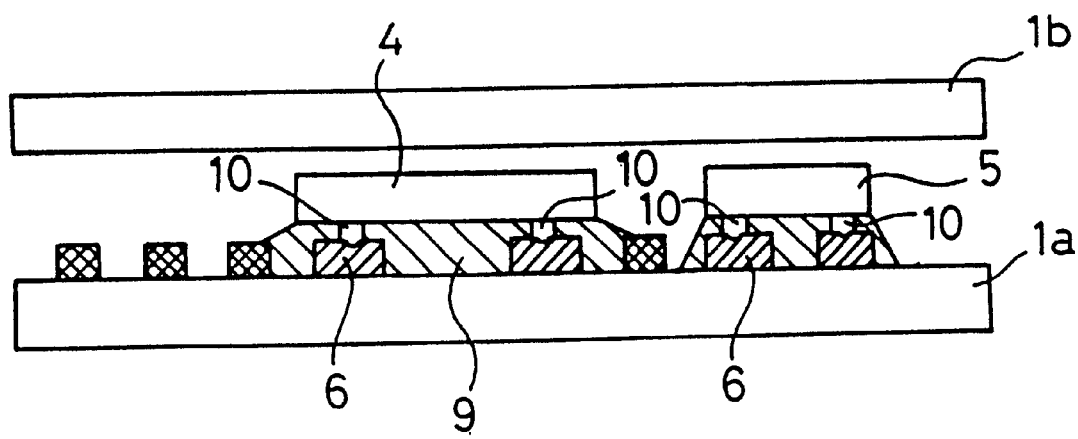
FIG. 13 is a schematic view showing the finished configuration of the conventional IC card.

As shown in FIG. 6, differing from FIG. 13 showing the above conventional example, in this embodiment, the manufacturing process is shortened and the productivity is improved, because the parts 16 are directly mounted on the connecting pads 6 made of the conductive paste before it is cured, rather than mounted by providing the anisotropic conductive sheet 9 between the connecting pads 6 and the parts 16.

Also, differing from FIG. 10 showing the above conventional example, since the jumper wiring means 8 is provided to connect the external end 3a and the internal end 3b of the coil pattern 3, it is not required to draw a plurality of coil patterns 3 between the terminals of the IC chip 4, and therefore it is possible to miniaturize the IC card.

Figure 7:
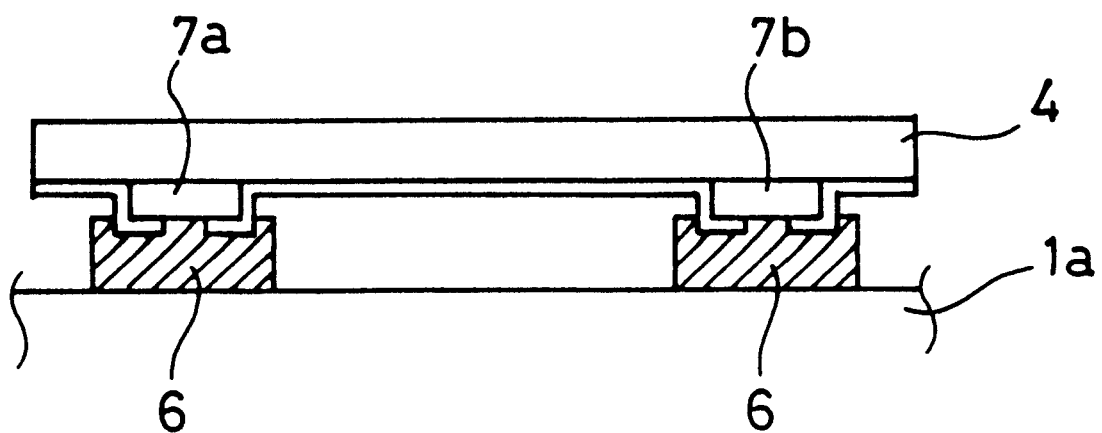
FIG. 7 is a schematic view showing the mounting of another IC chip according to the embodiment of the invention.

Here, while the IC chip 4 provided with the bumps 10a, 10b is mounted in the above described embodiment, the present invention is not limited to this embodiment, and it may be configured such that the first electrode pad 7a and the second electrode pad 7b directly contact with the connecting pads 6, as shown in FIG. 7.

In such a configuration, because of the absence of the bumps 10, it is possible to mount the parts at a low temperature and to reduce the number of steps to lower costs. Also, it is possible to lower the connecting resistance.

And, while in the above embodiment the jumper wiring means 8 is mounted before the conductive paste is cured, the jumper wiring means 8 may be provided after the conductive paste is cured.

Also, while in the above embodiment that is configured as shown in FIG. 5 is used for the jumper wiring means 8, however as instead of this, a thin laminate sheet, which has a thickness between 20 and 30 $\mu$m constituted of an insulating sheet and a conductive foil made by the vapor deposition of the metals such as copper, gold, and aluminium on an insulating sheet having a thickness on the order of 20 $\mu$m such as polyethylene terephthalate, can be used for the jumper wiring means 8 to obtain the same effect.

The jumper wiring means 8 constituted of the laminate sheet is placed such that the connecting pad 6a and the connecting pad 6c are linked to each other, with its insulating sheet facing the first substrate 1a and its conductive foil being to be the upper surface, and heat-welded. Then, another insulating sheet is placed over the portion of the conductive foil which is exposed upward.

In such a configuration, heat welding causes the connecting pads 6a and 6c to be electrically connected with each other via the conductive foil. Also, the welded portion of the insulating sheet provided below the conductive foil secures them.

And the jumper wiring means 8 may be formed by mounting the IC chip 4, and by curing the conductive paste, and by printing the pattern which links the connecting pads 6a and 6c over the coil pattern 3 by means of insulating ink as shown in FIG. 1, and by printing conductive ink over the pattern. Using such a jumper wiring means 8 makes it possible to make the IC card thinner, and the productivity can be improved due to its short drying time.

Figure 8:
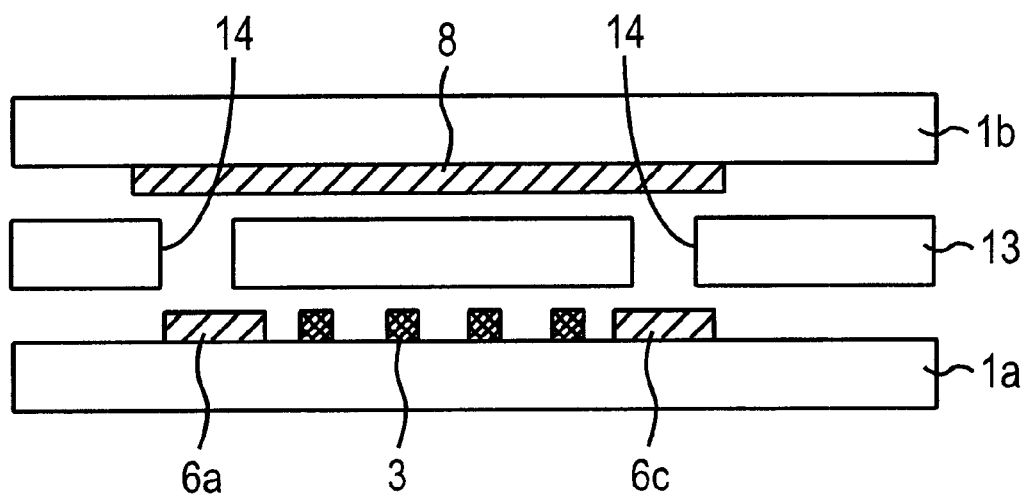
FIG. 8 is a schematic view showing the mounting of another jumper wire according to the embodiment of the invention.

As further shown in FIG. 8, it may be configured by forming the coil pattern 3 on the first substrate 1a as described above, and by painting the conductive paste on the second substrate 1b to provide the jumper wiring means 8.

Concretely, the circuit pattern including the coil pattern 3 is formed on the first substrate 1a in the same way as the above described embodiment.

The jumper wiring means 8 is provided on the second substrate 1b by applying the conductive paste at the position corresponding to the position which links the connecting pads 6a and 6c over the coil pattern 3 as shown in FIG. 1.

Then, the second substrate 1b is applied to the first substrate 1a, with an insulating film 13, which has communicating openings 14 formed at the positions corresponding to the connecting pads 6a, 6c, being interposed between the first substrate 1a and the second substrate 1b, and the conductive paste is cured.

Thus obtained IC card is configured such that the connecting pads 6a, 6c of the first substrate 1b are electrically connected with the jumper wiring means 8 of the second substrate 1b, and provides the same effect as the IC card in the above described embodiment.

Here, a plurality of insulating films 13 which are interposed between the first substrate 1a and the second substrate 1b may be provided, and the multilayer configuration can increase the number of turns of the coil pattern 3, and thus increased number of turns of the coil pattern 3 can increase the inductance of the coil.

Figure 9:
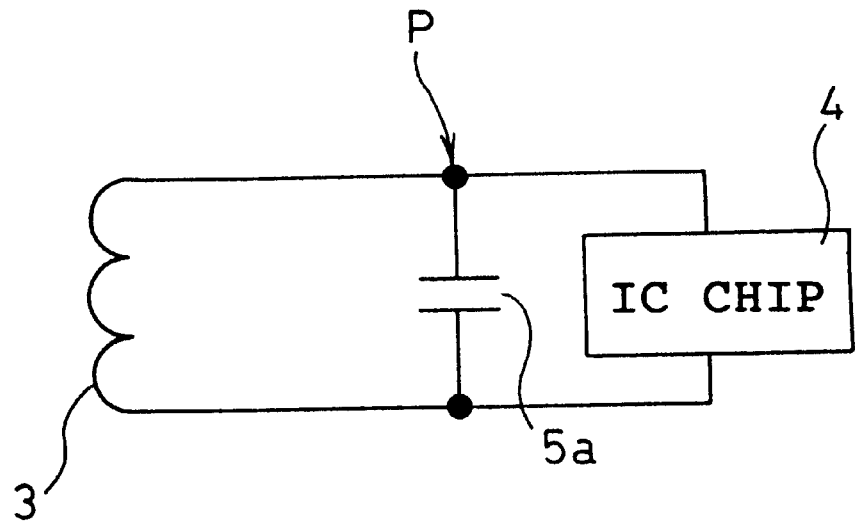
FIGS. 9(a)–(b) are an explanation view showing the electrical connection of an input circuit of the IC chip and the coil according to the embodiment of the invention.
Figure 9:
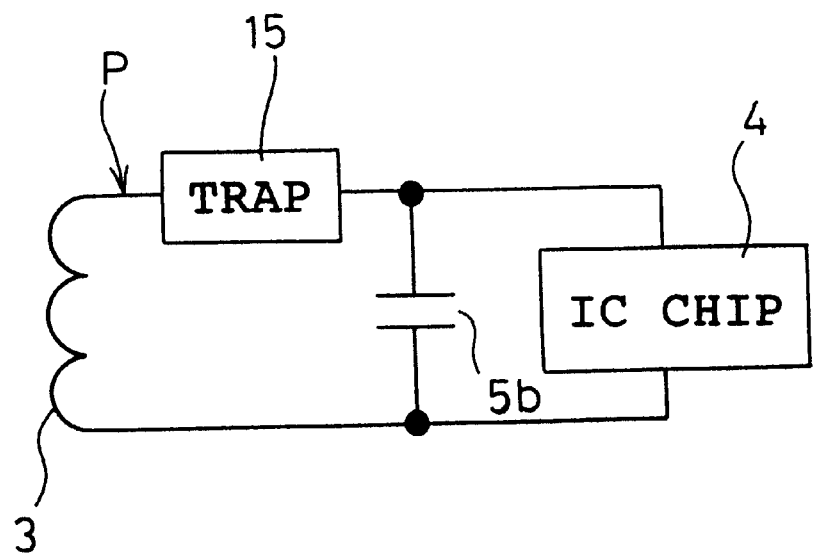

While the connecting point P in the coil 3 in the above embodiment can be considered to have a circuit configuration so as to be directly connected to the electrode pad drawn out of the IC chip 4 as shown in FIG. 9(a), if the connecting point P in the coil 3 is not directly connected to the electrode pad drawn out of the IC chip 4 as shown in FIG. 9(b), the present invention provides the same effect.

In another embodiment shown in FIG. 9(b), a trap 15 is interposed between the IC chip 4 and the coil 3, and the connecting point P in the coil 3 can be considered to be a signal line for the IC chip 4. The trap 15 mentioned here is a filter circuit which exhibits high impedance for useless frequency component which acts on the coil 3 from external, and low impedance for target frequency component which acts on the coil 3 from external.

Further, while above each embodiment has been described as for the coil 3 formed on the substrate by means of the coil pattern 3 by way of examples, in the case of mounting with only the heat treatment steps in the manufacturing process being reduced, the need to form the coil 3 as a pattern on the substrate is eliminated by printing the circuit pattern on the substrate by means of the conductive paste, placing the IC chip on the circuit pattern such that its electrodes are connected to the circuit pattern before the conductive paste is cured, and then curing the conductive paste to mount parts, and then the IC card may be configured by using the coil constituted of a wound line, and electrically connecting both ends of this coil constituted of the wound line with the electric circuit on the substrate using a technique such as soldering after the conductive paste is cured and the mounting of the parts is completed.

Further, while, in the above description, both ends of the coil constituted of the wound line are electrically connected to the cured circuit pattern, however the IC card may be configured by placing the IC chip, and any other chip parts, and both ends of the coil on the circuit pattern before cured, and then by curing the circuit pattern to establish the electrical connections.

What is claimed is:

1. A method for making an IC card comprising:

printing a circuit pattern comprising a conductive paste coil pattern on a substrate;

placing the IC chip on said circuit pattern to connect an electrode to the circuit pattern; and, placing a jumper wire comprising opposite ends, exposed conductive portions at the opposite ends, an enclosed conductive portion between the opposite ends, and an insulator between the opposite ends, the insulator over the conductive paste coil pattern and surrounding the enclosed conductive portion, the jumper wire to connect an electrode pad at an external end of said conductive paste coil pattern to either an electrode pad drawn out of the IC chip, or a signal line to said IC chip; and curing said conductive paste coil pattern after placing the jumper wire.

2. A method for making an IC card comprising:

printing a circuit pattern comprising a conductive paste coil pattern on a substrate;

placing an IC chip on said circuit pattern to connect an electrode to the circuit pattern;

curing the conductive paste coil pattern; and placing, after the conductive paste coil pattern is cured, a jumper wire comprising opposite ends, exposed conductive portions at the opposite ends, an enclosed conductive portion between the opposite ends, and an insulator between the opposite ends, the insulator over the conductive paste coil pattern and surrounding the enclosed conductive portion, the jumper wire to connect an electrode pad at an external end of said conductive paste coil pattern to an electrode pad drawn out of the IC chip.

3. The method of claim 2; further comprising:

printing an insulating ink pattern at a portion of the coil crossing the jumper wire and the substrate, said insulating pattern linking the electrode pad at the external end of the conductive paste coil pattern and the electrode pad drawn out of the IC chip; and printing conductive ink over said insulating pattern.

4. A method for making an IC card, comprising:

providing first and second substrates;

printing a circuit pattern comprising a conductive paste coil pattern on the first substrate;

placing an IC chip on said circuit pattern to connect an electrode to the circuit pattern and the first substrate;

curing said conductive paste coil pattern after placing the IC chip;

printing a conductive paste jumper wire on the second substrate laminated over said first substrate, the conductive paste jumper wire at a position corresponding to a portion of the first substrate for connecting the electrode pad at the external end of said conductive paste coil pattern and the electrode pad drawn out of the IC chip over the conductive paste coil pattern formed on said first substrate;

interposing an insulating film having communicating openings defined therein at positions corresponding to the electrode pad at the external end of said conductive paste coil pattern and the electrode pad drawn out of the IC chip between the first and second substrates; and curing the conductive paste jumper wire of the second substrate to connect the electrode of said first substrate to said second substrate.

* * * * *